(12) United States Patent
Raic et al.

(10) Patent No.: US 11,357,120 B2
(45) Date of Patent: Jun. 7, 2022

(54) ELECTRICAL COMPONENT ENCLOSURE AND METHOD OF USE

(71) Applicant: Phoenix Contact Development and Manufacturing, Inc., Middletown, PA (US)

(72) Inventors: Dejan Raic, Harrisburg, PA (US); Steven Christopher Farmer, Dauphin, PA (US)

(73) Assignee: Phoenix Contact Development and Manufacturing, Inc., Middletown, PA (US)

( * ) Notice: Subject to any disclaimer, the term of this patent is extended or adjusted under 35 U.S.C. 154(b) by 0 days.

(21) Appl. No.: 17/018,145

(22) Filed: Sep. 11, 2020

(65) Prior Publication Data

US 2022/0087042 A1    Mar. 17, 2022

(51) Int. Cl.
| | | |
|---|---|---|
| *H05K 5/00* | (2006.01) | |
| *H05K 5/02* | (2006.01) | |
| *H05K 7/14* | (2006.01) | |

(52) U.S. Cl.
CPC ......... *H05K 5/0221* (2013.01); *H05K 5/0239* (2013.01); *H05K 7/1402* (2013.01); *H05K 7/1427* (2013.01)

(58) Field of Classification Search
USPC ........ 361/752, 728, 759, 796, 800, 801, 803
See application file for complete search history.

(56) References Cited

U.S. PATENT DOCUMENTS

| | | | |
|---|---|---|---|
| 5,551,589 A * | 9/1996 | Nakamura | ............ E05C 19/066 220/326 |
| 5,577,779 A * | 11/1996 | Dangel | ................... E05C 19/06 220/326 |
| D377,339 S | 1/1997 | Beruscha et al. | |
| 6,486,399 B1 | 11/2002 | Armstrong et al. | |
| 6,550,170 B1 | 4/2003 | Cooper et al. | |
| 6,969,034 B2 | 11/2005 | Ware et al. | |
| 6,988,697 B2 | 1/2006 | Ware et al. | |
| 7,059,572 B2 | 6/2006 | Ware et al. | |
| 7,413,479 B1 | 8/2008 | Volpone | |
| 7,417,868 B2 * | 8/2008 | Morisada | ............. H05K 7/1405 361/741 |
| 8,648,264 B2 * | 2/2014 | Masumoto | ............. H02G 3/081 174/520 |
| 9,113,561 B2 | 8/2015 | Kominami et al. | |
| 9,161,465 B2 | 10/2015 | Chen et al. | |
| 9,214,793 B2 * | 12/2015 | Shiraki | ................. H02G 3/088 |
| 9,967,993 B1 | 5/2018 | Walker et al. | |
| 9,985,422 B2 | 5/2018 | Jett et al. | |
| D827,575 S | 9/2018 | Oyster | |
| 10,129,993 B2 | 11/2018 | Tollefsbol et al. | |
| 10,386,013 B2 | 8/2019 | Walker et al. | |
| 2008/0239632 A1 | 10/2008 | Wayman | |
| 2009/0289158 A1 | 11/2009 | Nelson et al. | |

(Continued)

FOREIGN PATENT DOCUMENTS

| | | |
|---|---|---|
| DE | 19642517 A1 | 4/1998 |
| WO | 2018224484 A1 | 12/2018 |
| WO | 2019192925 A1 | 10/2019 |

*Primary Examiner* — Hung S. Bui
(74) *Attorney, Agent, or Firm* — Hooker & Habib, P.C.

(57) ABSTRACT

An enclosure assembly for housing printed circuit boards and related electrical components having a secured faceplate that may be removed by use of a hand tool.

19 Claims, 11 Drawing Sheets

(56) References Cited

U.S. PATENT DOCUMENTS

2012/0001041 A1 1/2012 Yang et al.
2013/0026160 A1 1/2013 Hu
2016/0007488 A1 1/2016 Neustadt

* cited by examiner

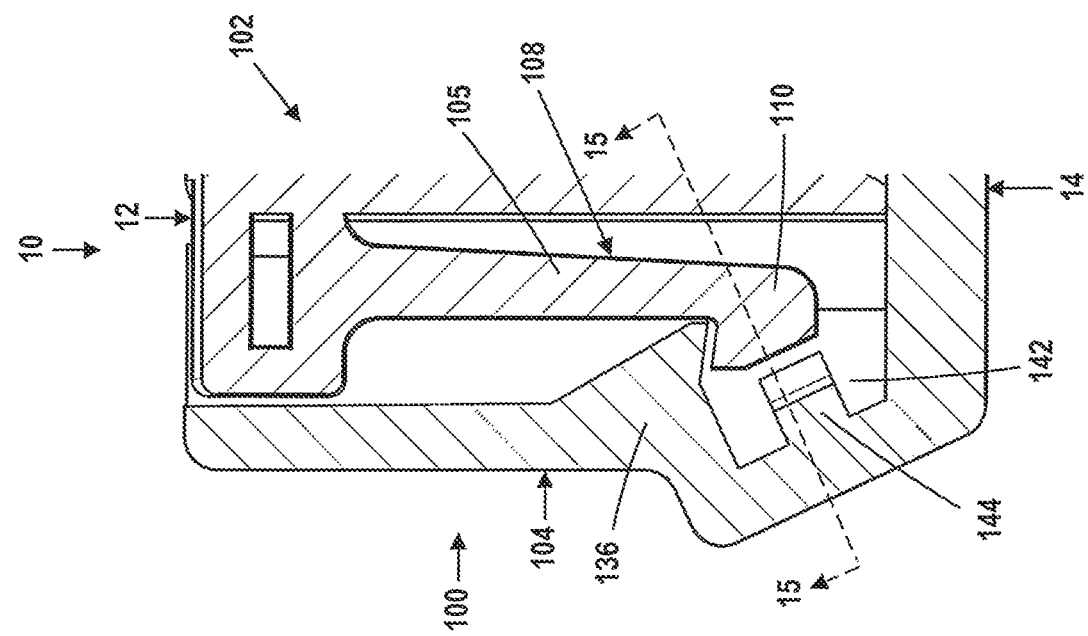
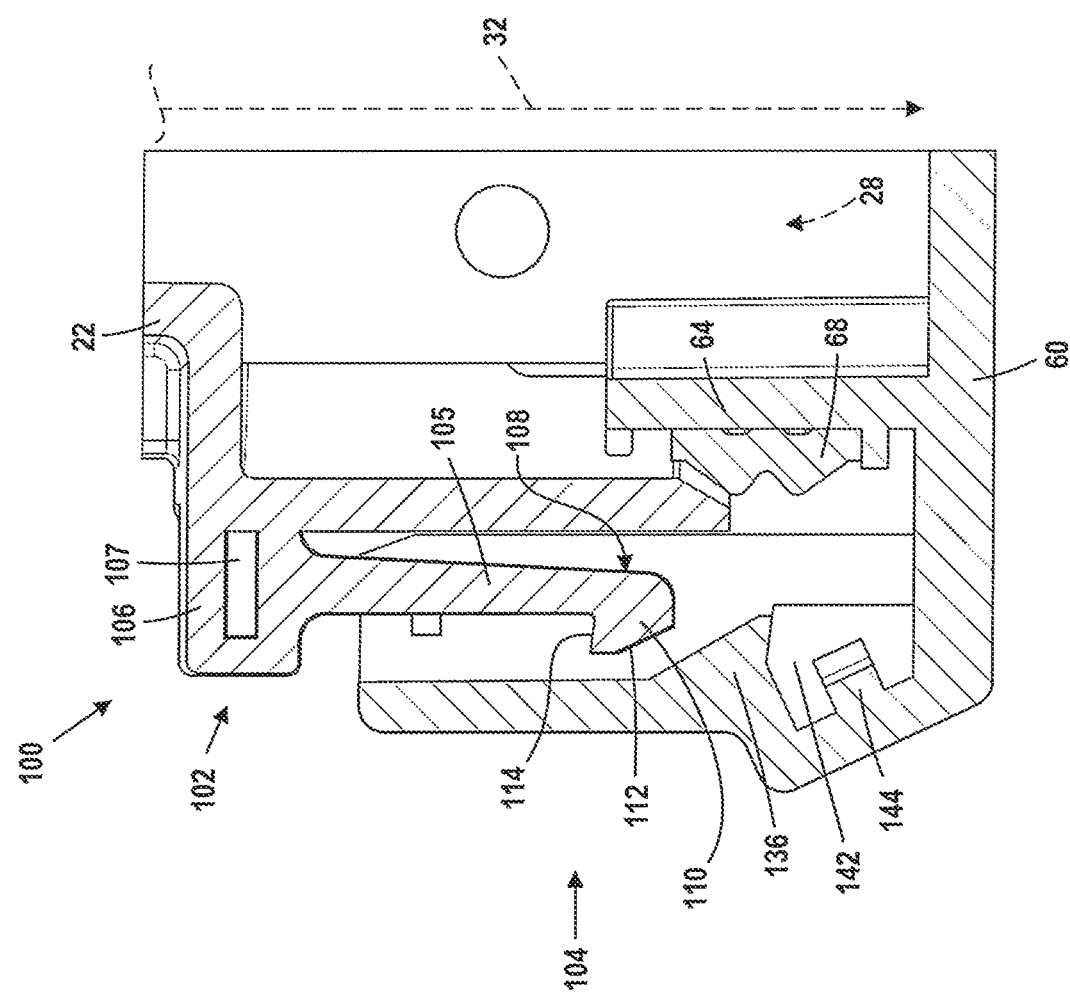
Fig. 12
Fig. 13

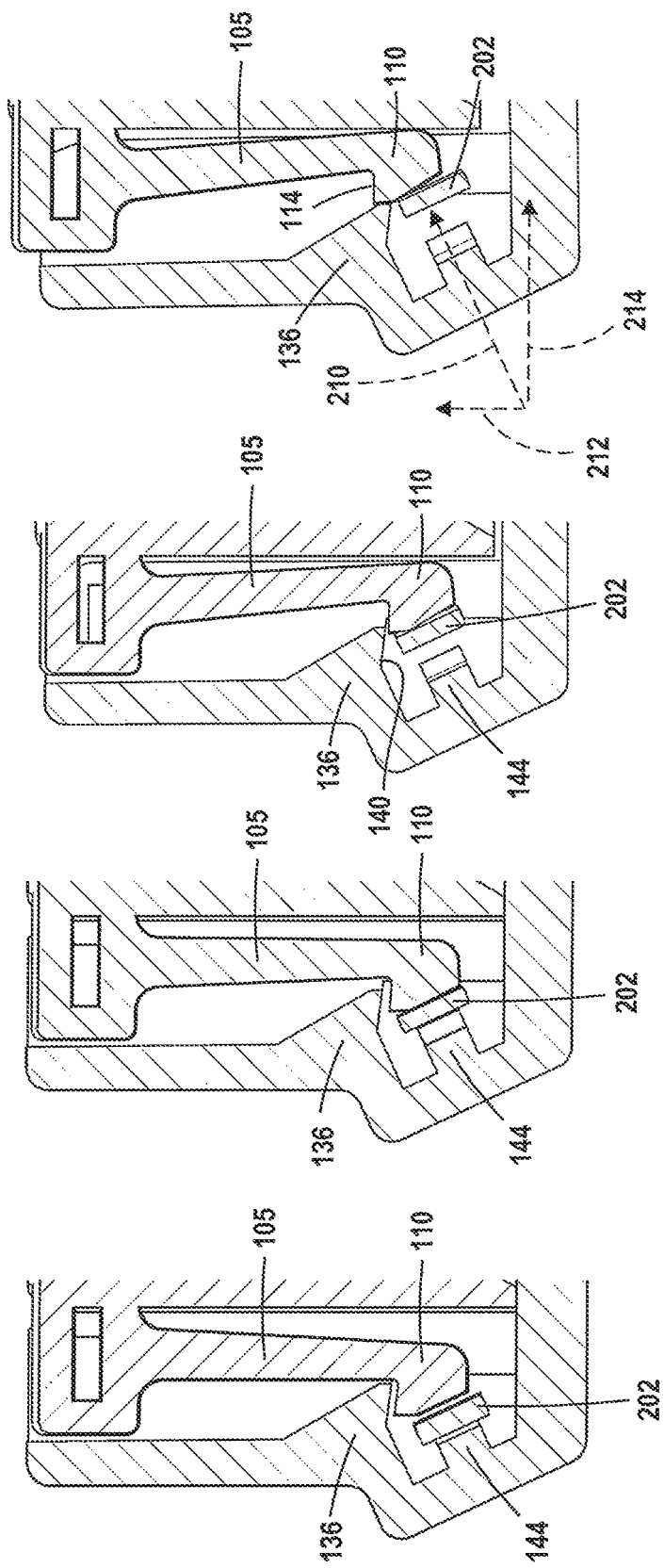

ELECTRICAL COMPONENT ENCLOSURE AND METHOD OF USE

FIELD OF THE DISCLOSURE

The disclosure relates to electrical component enclosures and in particular to latches for securing lids to electrical component enclosures.

BACKGROUND OF THE DISCLOSURE

Enclosures for housing electrical components such as printed circuit boards (PCBs), electronic modules and like electrical components are known. Enclosures are typically made of plastic or metal and are designed to house electrical components within a secured recess. The enclosures are adapted for installation in different indoor and outdoor environments to meet end application needs.

It is known for electrical component enclosures to have removable faceplates or lids. Lids may be secured in place to an enclosure through the use of various kinds of retention latches.

It is known to actuate latch components through the use of elongate tools having blade, such as a screwdriver to allow lid removal.

The process of using a tool to actuate latch components is problematic. To actuate latch components, the tool blade must be properly located to engage and exert forces onto certain latch elements. Properly locating a tool blade to actuate small latch components can be difficult and time-consuming.

As latch elements may be located within an enclosure recess or other protective structure to prevent inadvertent latch actuation, visual confirmation of component engagement and actuation by a tool blade is difficult or not possible in the field. This can result in poor location of the tool blade.

When a disengagement force is applied to the tool, poor location of the tool blade can result in failed actuation of latch elements, undesired placement of the tool blade away from latch elements and potential damage to the enclosure or the components held therein.

Once the actuation of the latch elements is achieved, a user must use a free hand to remove the lid from the enclosure body while continuing to apply the disengagement force on latch elements though the tool blade. The need to use two hands simultaneously to achieve lid removal complicates the procedure and further increases the risk for blade dislocation.

Thus, it is desirable to provide an electrical component enclosure that allows for improved latch actuation. The enclosure should allow user actuation through use of a tool blade to overcome the challenges discussed above.

BRIEF SUMMARY OF THE DISCLOSURE

Disclosed is an electrical component enclosure assembly that provides improved latch actuation and lid removal through the use of hand tools having a flat blade, such as a screwdriver blade.

The disclosed enclosure includes elements to properly locate a tool blade proximate latch elements and facilitate the application of force by the tool blade to actuate latch elements and disengage the enclosure lid in one motion. The enclosure allows for simplified disengagement the lid from the enclosure.

The disclosed enclosure also provides the user with physical feedback to inform the user of proper latch actuation during the lid removal procedure.

Other objects and features will become apparent as the description proceeds, especially when taken in conjunction with the accompanying drawing sheets.

BRIEF DESCRIPTION OF THE DRAWINGS

FIG. 12 is a sectional view like FIG. 11 showing the enclosure faceplate disengaged from the enclosure body;

FIG. 13 is a sectional view showing the enclosure lid engaged to the enclosure body;

FIGS. 21-24 are sectional views like FIG. 12. showing actuation of the enclosure latch assembly.

DETAILED DESCRIPTION

Figure 1:
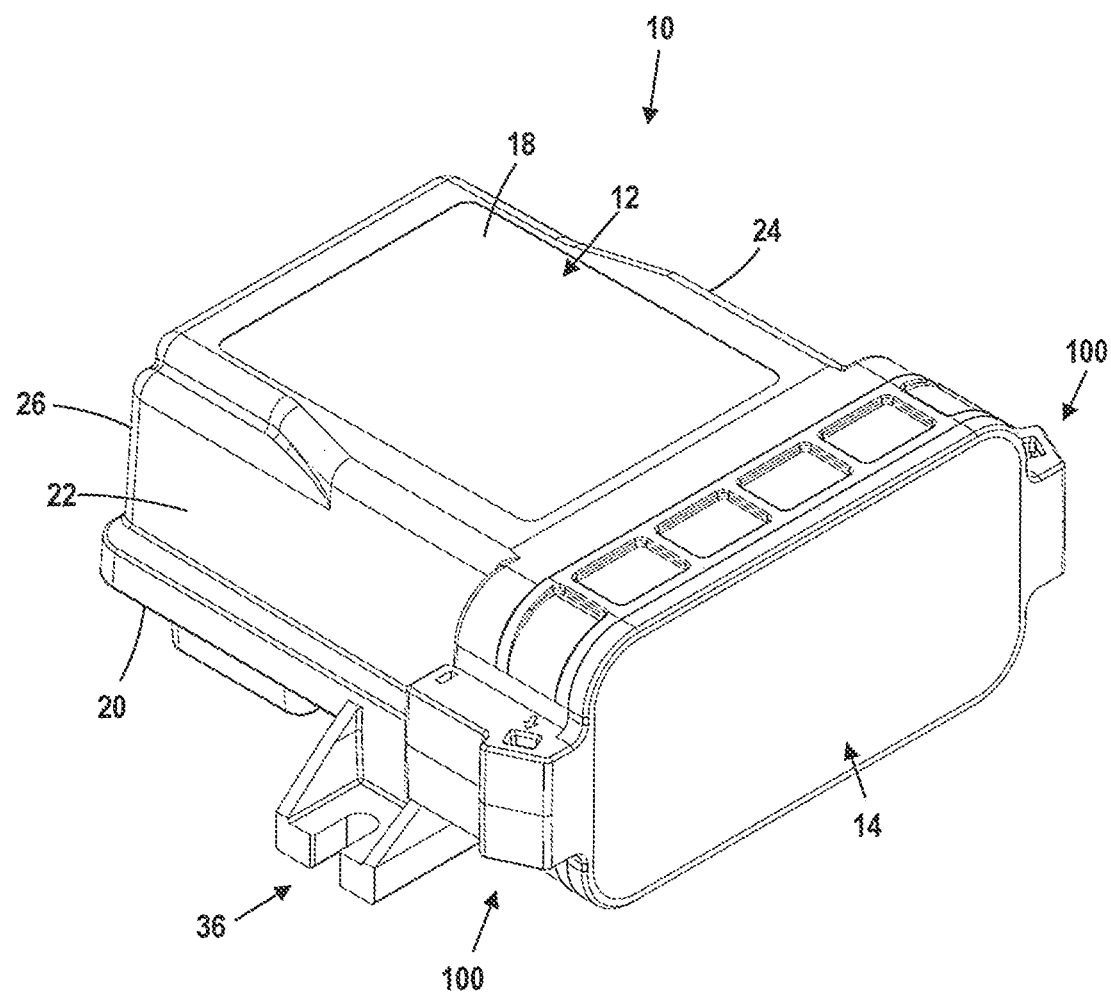
FIG. 1 is a perspective view of an electrical component enclosure having an enclosure body with an installed enclosure faceplate and including the disclosed latch assembly.
Figure 2:
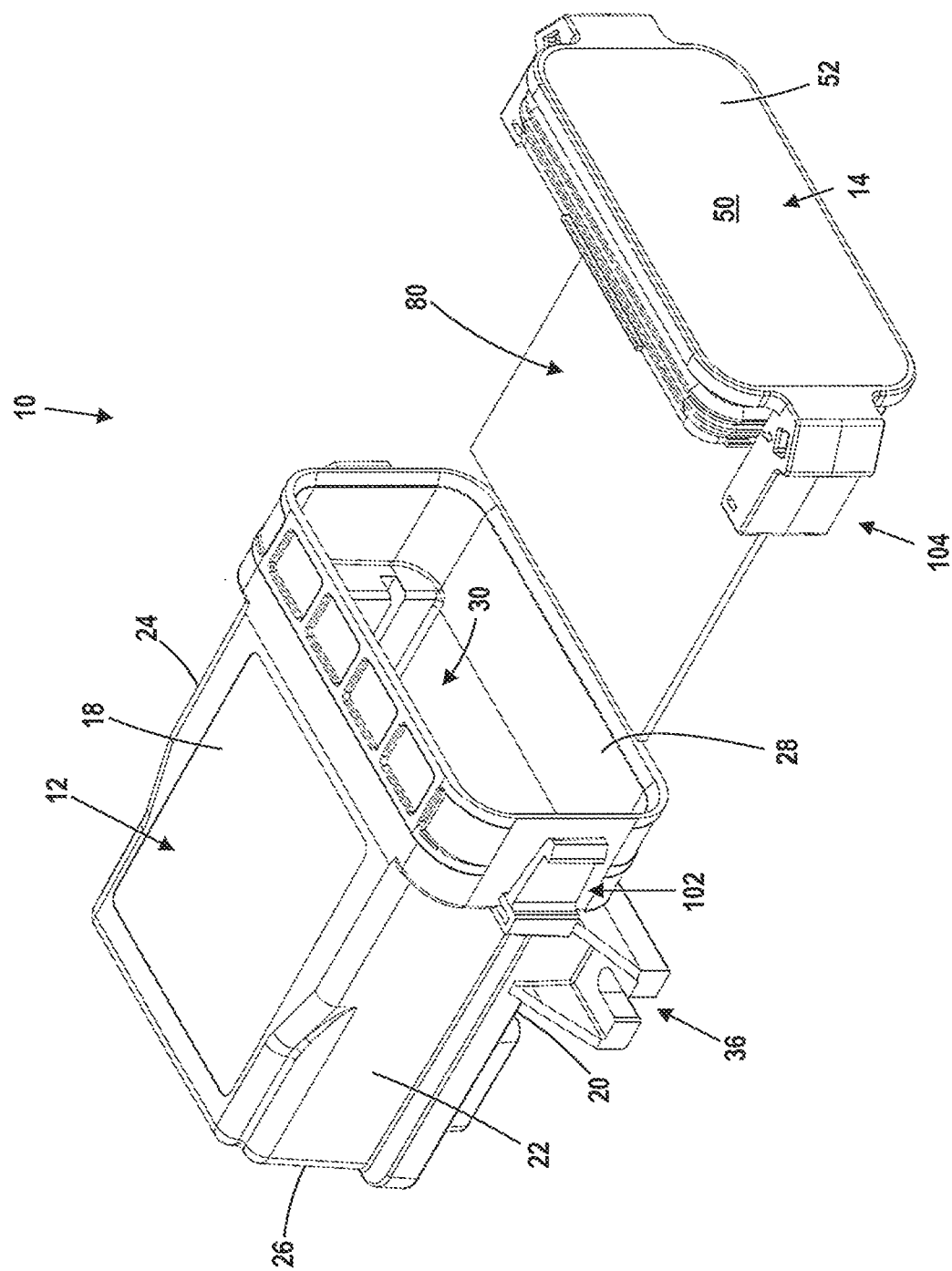
FIG. 2 is an exploded view of the enclosure body and faceplate.
Figure 3:
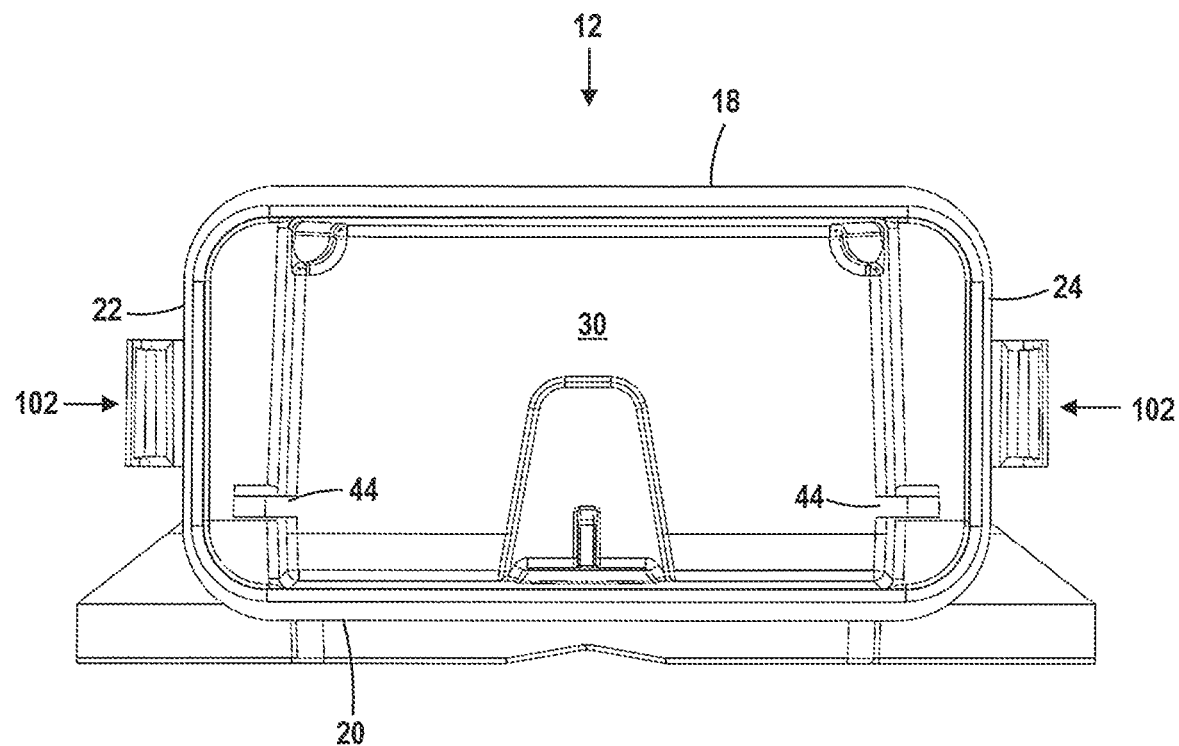
FIG. 3 is a front view of the enclosure body.
Figure 4:
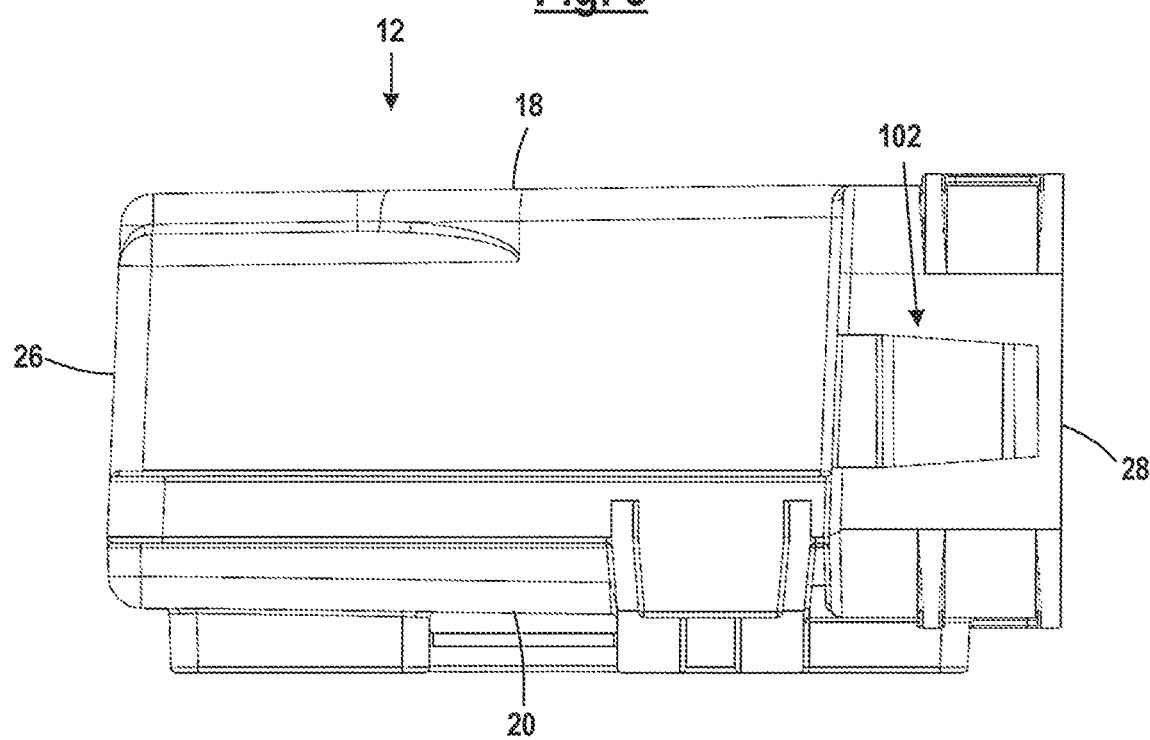
FIG. 4 is a side view of the enclosure body.

FIG. 1 shows an electrical component enclosure assembly 10 having an enclosure body 12 and an enclosure lid or faceplate 14. Enclosure body 12 and enclosure faceplate 14 may each be molded from plastic, other insulating materials or formed from metal.

As shown in the figures, enclosure body 12 is generally rectangular in shape and is made up of five body walls: top wall 18, bottom wall 20, side walls 22, 24, and rear wall 26. Enclosure mouth opening 28 leads into enclosure internal cavity 30. The surrounding body walls define cavity 30 which has a generally rectangular shape, having a major axis 32 extending from the enclosure mouth 28 to rear wall 26 and a minor axis 34 extending between side walls 22, 24. Minor axis 34 extends generally parallel to enclosure mouth opening 28.

Figure 5:
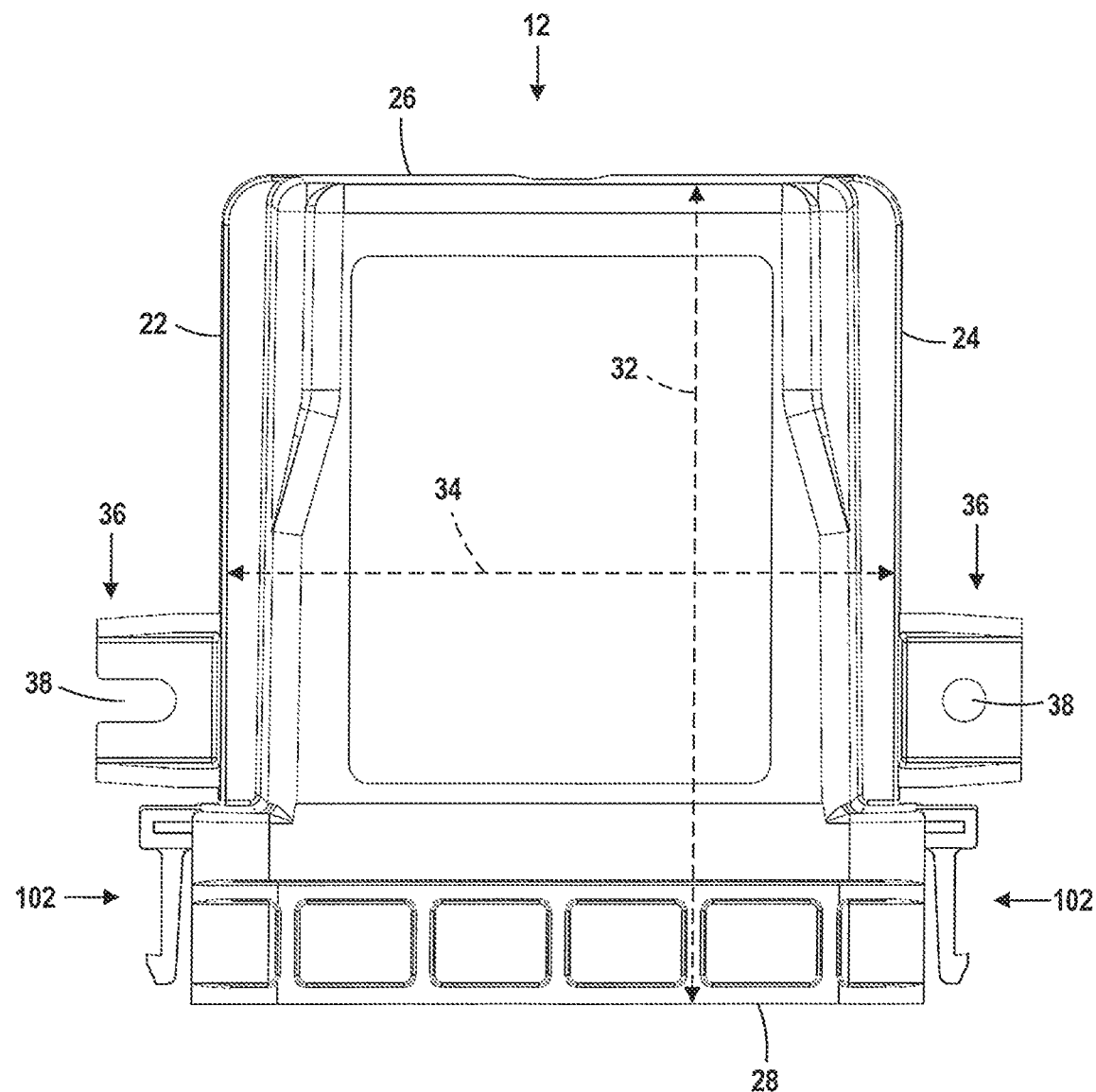
FIG. 5 is a top view of the enclosure body.
Figure 6:
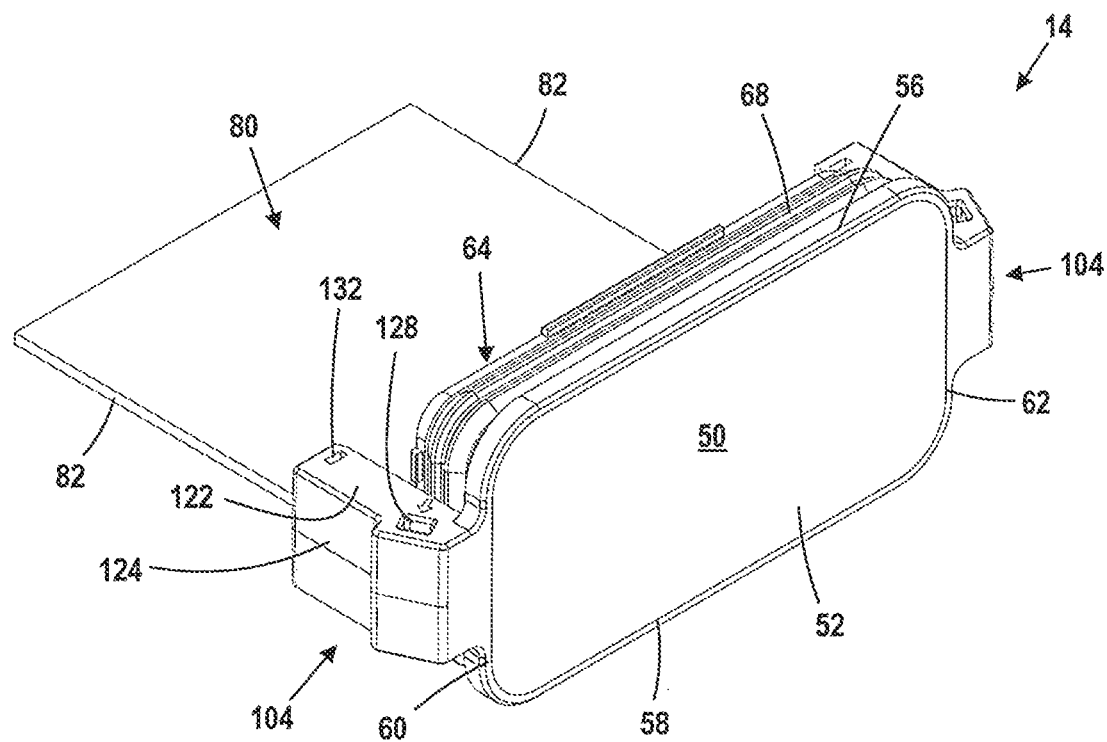
FIG. 6 is a front perspective view of the enclosure faceplate and an electrical component circuit board.

Two enclosure assembly feet 36 extend from the bottom of body 12 proximate enclosure body side walls 22, 24 and enclosure body bottom wall 20. Each foot 36 is generally rectangular in shape and may have foot apertures 38 extending through the foot. As illustrated in FIG. 5, foot apertures 38 may be surrounded by a foot 36 or be open to the exterior of foot 36. Foot apertures 38 may be used to secure enclosure assembly 10 to a support surface by extending a fastener through an aperture 32.

Enclosure internal cavity 30 may include mounting elements to facilitate the secure installation of a printed circuit board, electronic modules and like electrical components therein. Enclosure body side walls 22, 24 having side wall interior surfaces 40, 42 may each have a PCB holder slot 44. Each holder slot 44 faces the holder slot 44 on an opposed side wall interior surface. Slots 44 are sized to accept a printed circuit board or like generally flat electrical component element.

In other embodiments, enclosure internal cavity 30 may have other mounting elements to facilitate the installation of an electrical component therein. An electrical component may be mounted to an enclosure body interior wall surface by conventional a fastener, adhesives or the like.

Enclosure lid or faceplate 14 has a generally flat, rectangular shaped body 50. Body 50 has a front face 52 and a rear face 54. Body 50 includes faceplate top and bottom portions 56, 58 and faceplate side portions 60, 62.

The rear face 54 of lid or faceplate 14 may include a circumferential mounting flange 64 extending away from face 54. Mounting flange 64 is made of a flange wall 66 having a generally uniform thickness and being generally rectangular in shape, extending circumferentially proximate body 50 portions 56, 58, 60 and 62. Mounting flange 64 is adapted to fit within the interior of enclosure mouth 28 when lid or faceplate 14 engages enclosure body 12 at the closure of assembly 10.

Mounting flange 64 may include a circumferential gasket 68 located at the exterior of mounting flange 64. Gasket 68 may be made of silicone, rubber or a like elastomer to provide an improved fit between mounting flange 64 and the interior of enclosure mouth 28 as well as protection from moisture seepage, environmental contamination and the like into cavity 30 at the closure of assembly 10.

Figure 7:
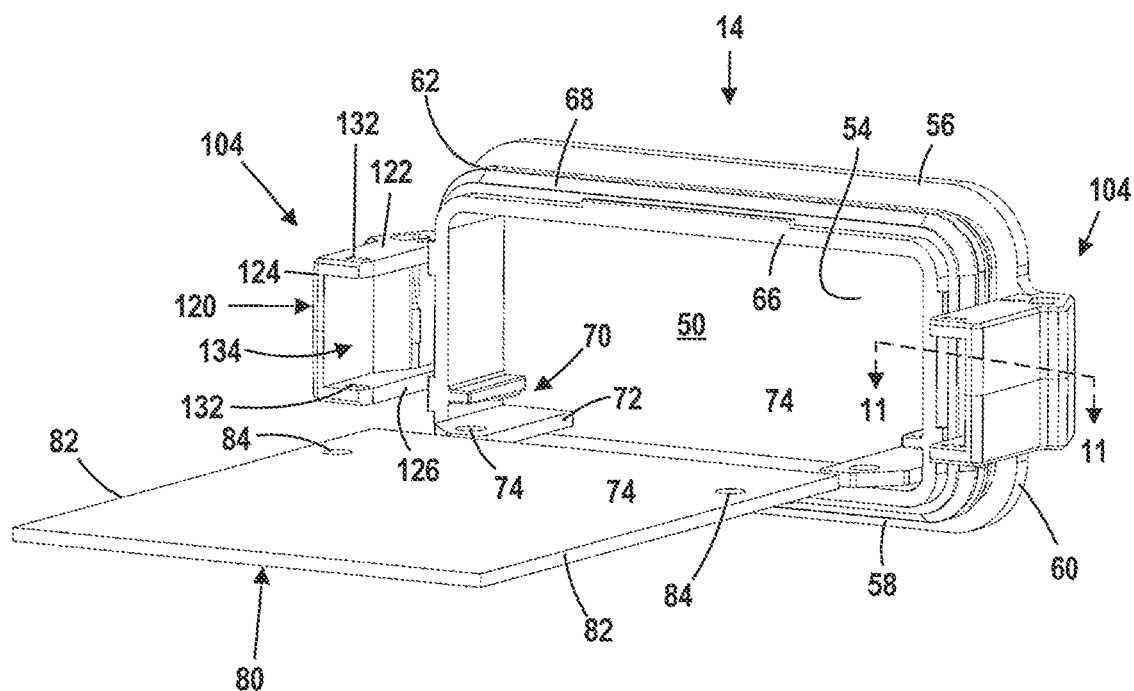
FIG. 7 is a rear perspective view of the enclosure faceplate and an electrical component circuit board.

The rear face 54 of lid or faceplate 14 may also include a pair of PCB holder slots 70 located between opposed cover side portions 60, 62 and extending inwardly from flange wall 66 as shown in FIG. 7. PCB holder slots 70 face each other and are sized to accept a printed circuit board or like generally flat electrical component element, like slots 44, described above. Slots 70 may include a lower PCB mounting flange 72 extending away from face 54 and having a flange mounting aperture 74.

In embodiments, a printed circuit board 80 or like electrical component including generally flat elements may be mounted to assembly 10. This may be accomplished by insertion of a board 80 having opposed side edges 82 into cavity 30 so that edges 82 engage PCB holder slots 38 and/or PCB holder slots 70. In embodiments, a printed circuit board 80 may include one or more mounting apertures 84 located proximate edges 82 and aligned with flange mounting aperture 74 during board installation. A faster located through aligned apertures 74 and 84 may be used to secure a printed circuit board 80 to faceplate 14.

Electrical component enclosure assembly 10 includes a pair of enclosure faceplate actuation assemblies 100, each assembly located proximate the enclosure mouth 28 a side wall 22, 24 respectively.

Each actuation assembly 100 is formed by a retention latch assembly 102 located on enclosure body 12 and a latch engagement assembly 104 located on faceplate 14.

Each retention latch assembly 102 is located on an enclosure body side wall 22, 24 and proximate enclosure mouth 28.

Each retention latch assembly 102 includes a latch arm 105 extending from latch base 106 to a latch hook 108. Latch base 106 is joined to an enclosure body side wall 22, 24 and may include a latch security aperture 107 extending from the top of the base proximate top wall 18 to the bottom of the base proximate bottom wall 20.

Latch arm 105 is flexible and to allow deflection during assembly use as described below.

Latch hook 108 includes latch head 110 having camming surface 112 and hook retention surface 114.

Figure 11:
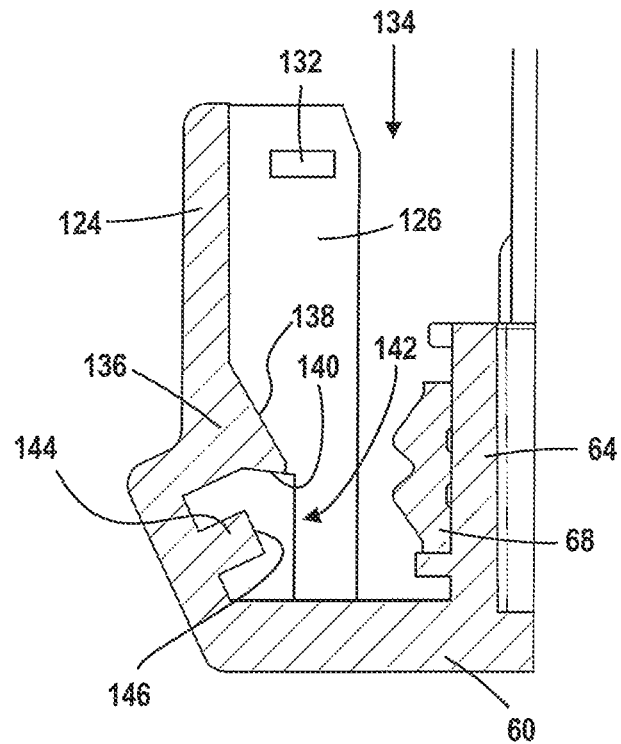
FIG. 11 is a sectional view of the enclosure faceplate latch assembly elements, taken along line 11-11 of FIG. 7.

Each latch engagement assembly 104 is located on a faceplate portion 60, 62 and extends away from front face 52 proximate mounting flange 64. See FIG. 11.

Each latch engagement assembly 104 includes a generally C-shaped latch engagement assembly wall 120 having a top wall 122, a side wall 124 and a bottom wall 126 as shown in FIG. 7. Tool positioning aperture 128 extends through top wall 122 and is located proximate to faceplate body 50.

Tool positioning aperture 128 includes a circumferential mouth having a chamfered surface 130 located adjacent the outer surface of top wall 122.

The outer surface of top wall 122 may include a locating indicia 131 proximate tool positioning aperture 128. In the figures, locating indicia 131 is shown as an arrow symbol pointed toward aperture 128, but other indicia symbols may also be used. The use of an arrow symbol may indicate the direction of rotation for a tool inserted into tool positioning aperture 128 to actuate the assembly latch in use of the assembly as described below.

Figure 17:
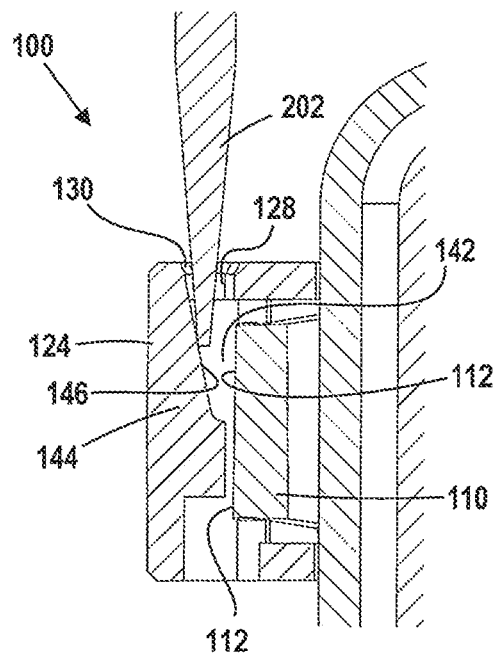
FIGS. 17-20 are sectional views like FIG. 15. showing actuation of the enclosure latch assembly.
Figure 20:
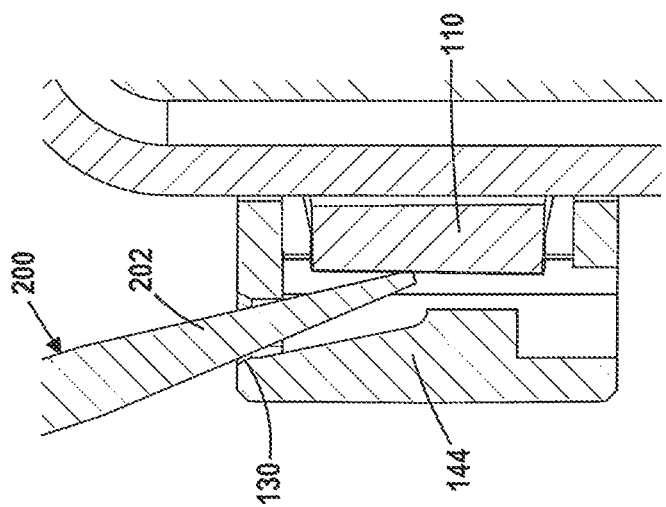
Figure 19:
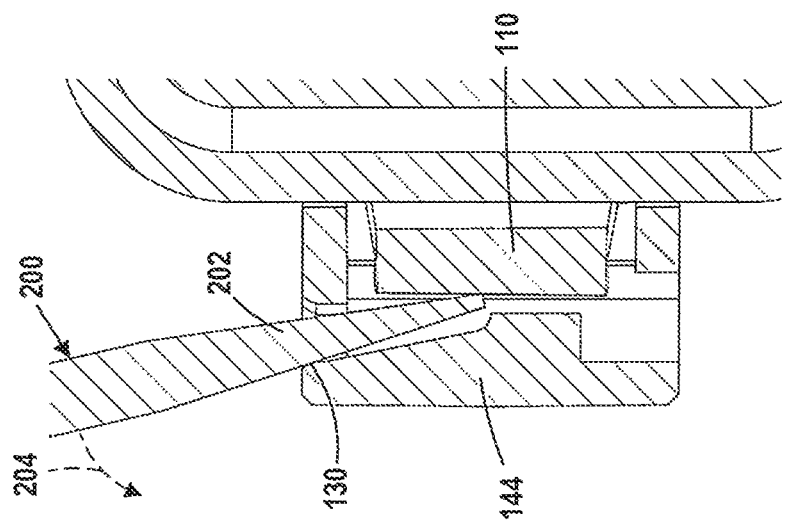
Figure 18:
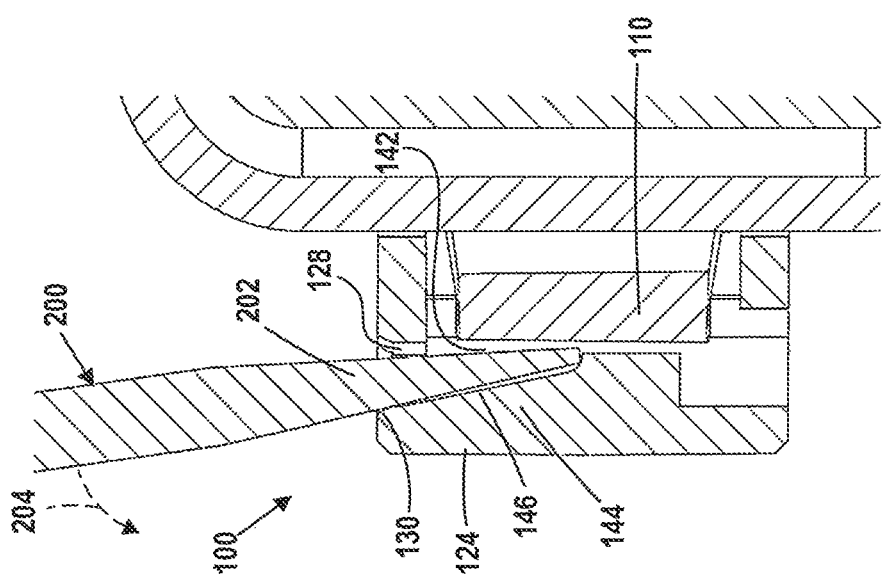

As tool blade 202 is fully inserted into tool-location cavity 142, tool 200 is rotated from a vertical position as shown in FIG. 17 to an angled position as shown in FIG. 18 in the direction of arrow 204. At this point, tool blade 202 is predominantly in contact with said tool positioning aperture ramp surface 146. As tool 200 is further rotated in the direction of arrow 204, tool 200 engages and pivots against camming surface 130 so that tool blade 202 disengages from ramp surface 146 and engages camming surface 112 to actuate latch hook 108 away from retention element 136 as shown in FIG. 19.

Top and bottom walls 122, 126 include aligned engagement assembly security apertures 132.

Latch engagement assembly wall 120 defines a latch engagement assembly cavity 134 within each latch engagement assembly 104. Cavity 134 is generally defined by walls 122, 124, 126 and faceplate mounting flange 64. See FIGS. 7 and 11.

Within cavity 134, assembly side wall 124 includes retention element 136, having camming surface 138 and retention surface 140.

Cavity 134 also includes tool-location cavity 142 defined generally by retention surface 140, side wall 124, and the rear face 54 of faceplate 14.

Tool-location cavity 142 is located under and is generally continuous with tool positioning aperture 128.

Tool-location cavity 142 includes ramp element 144 having a ramp surface 146. Ramp surface 146 generally faces away from wall 124 and toward flange 64. Ramp surface 146 tapers outwardly as it extends from tool positioning aperture 128 to ramp element base 148. See FIG. 16.

Figure 8:
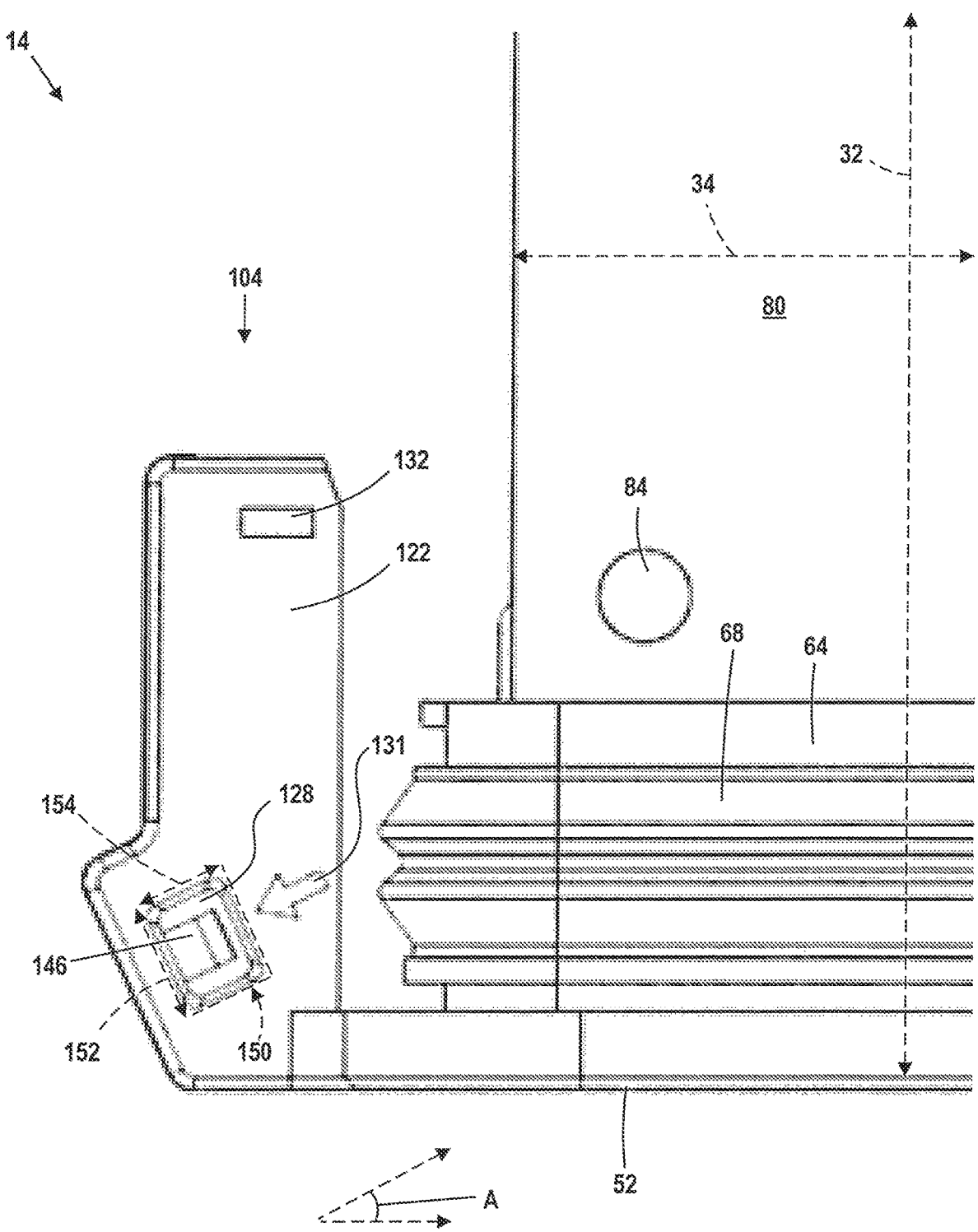
FIG. 8 is a detail top view of the enclosure faceplate and an electrical component circuit board.
Figure 9:
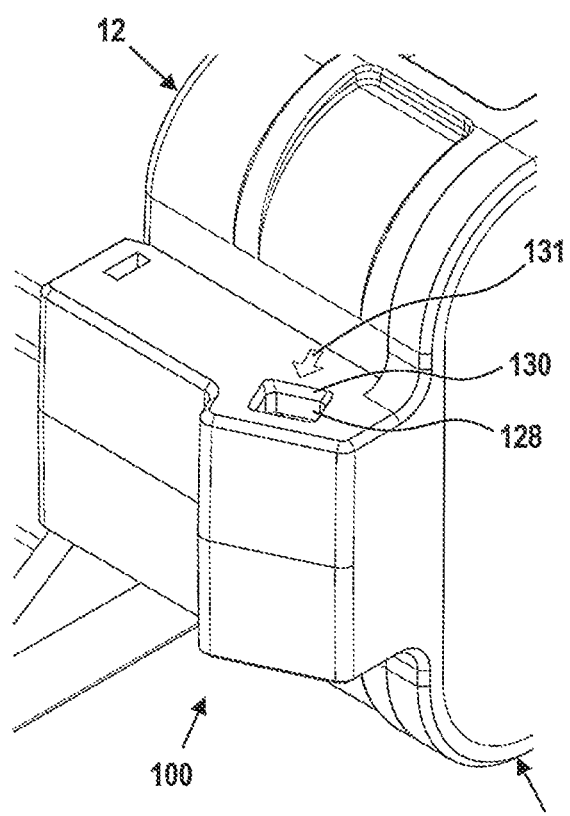
FIG. 9 is a perspective view of an enclosure latch assembly.
Figure 10:
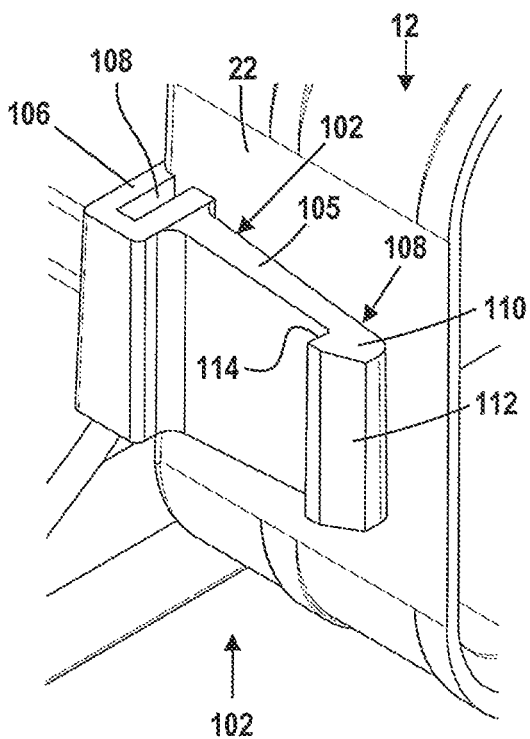
FIG. 10 is a perspective view of an enclosure body retention latch assembly.

As shown in FIG. 8, tool positioning aperture 128 has a generally rectangular cross section 150, having a major axis 152 and a minor axis 154. In alternate assembly embodiments, tool positioning aperture 128 may have a nonrectangular cross section 150, including square cross sections, circular cross sections and cross sections having other shapes.

When enclosure faceplate 14 is mounted to enclosure body 12 in assembly 10, aperture 128 minor axis 154 is off-set from the minor axis 34 of cavity 30 by an angle A. Angle A may be approximately 25 degrees. In embodiments, angle A may range between 20 degrees and 30 degrees.

In assembly embodiments, aperture 128 major axis 152 is off-set from the major axis 32 of cavity 30 to the same degree as latch hook 108 camming surface 112 is off-set from the major axis 32 of cavity 30. This configuration allows reliable contact between a tool blade inserted into tool positioning aperture 128 and camming surface 112 as disclosed below.

Rectangular cross section 150 of tool positioning aperture 128 allows is sized to allow the insertion of tools having a flat blade, such as a flat screwdriver blade. In assembly embodiments, the length of the major axis 32 may be approximately 3.6 millimeters and the length of minor axis 34 may be approximately 2.6 millimeters to allow insertion of a correspondingly sized flat screwdriver blade.

Use of electrical component enclosure assembly 10 will now be described.

FIG. 1 shows electrical component enclosure assembly 10, having an enclosure faceplate 14 secured to enclosure body 12. In assembly 10, enclosure actuation assemblies 100 secure faceplate 14 to body 12 and allow removal of faceplate 14 therefrom through use of a screwdriver or like tool having a flat blade.

FIG. 13 is a sectional view of an actuation assembly 100 in the secured position, having enclosure faceplate 14 secured to enclosure body 12. In the secured position latch assembly 102 engages latch engagement assembly 104 to secure faceplate 14 to enclosure body 12. Latch hook 108 engages retention element 136 so that hook retention surface 114 is proximate retention surface 140.

In the secured position retention latch assembly latch security aperture 107 and latch engagement assembly security apertures 132 are aligned to allow placement of a security retention band, zip-tie of like security retention element to secure assembly 10 in the secured position, prevent tampering with assembly 10 and/or provide an indication in case assembly tampering occurs.

Figure 14:
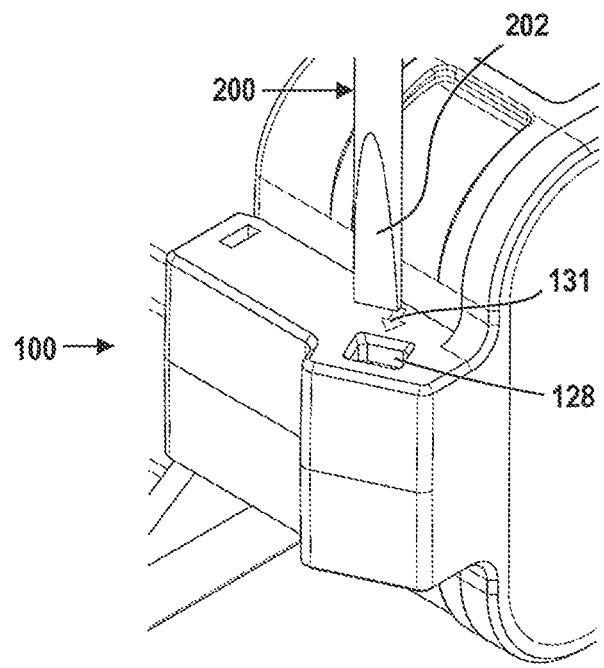
FIG. 14 is a perspective view of the enclosure latch assembly with a hand tool.
Figure 15:
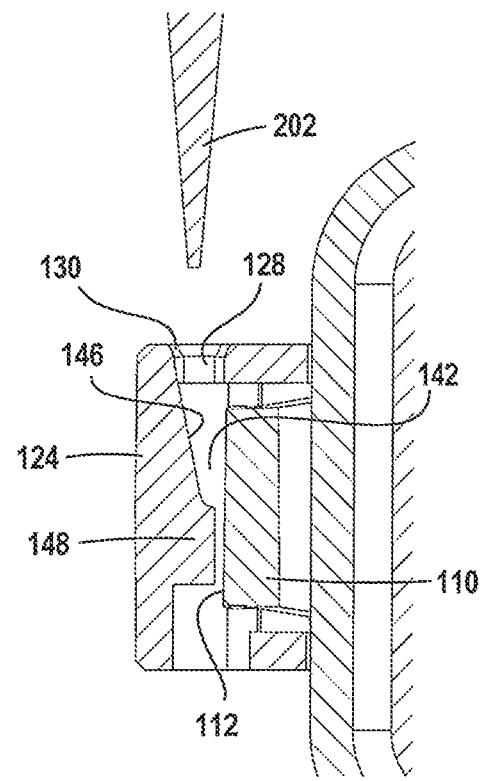
FIG. 15 is a sectional view taken along line 15-15 of FIG. 13.

FIGS. 14 and 15 show the positioning of a tool 200 having a tool blade 202 proximate actuation assembly 100 and tool positioning aperture 128 as a first step in the procedure of using actuation assembly 100 to disengage and remove faceplate 14 from body 12.

Hand tool 200 is shown in the figures as a flathead screwdriver having a tool blade or tool end 202. Use of other types of hand tools with assembly 10 is also contemplated, such tools having an elongate shaft terminating at a shaft end that is generally uniform with the shaft including Phillips head screwdrivers, awls and like tools, so long as the shaft end properly fits within tool positioning aperture 128.

Assembly locating indicia 131 directs a user to insert a tool blade 202 into tool positioning aperture 128.

Figure 16:
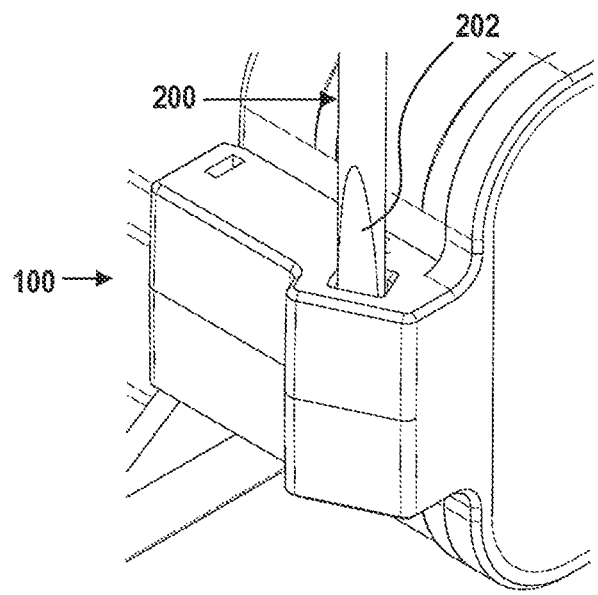
FIG. 16 is a perspective view of the enclosure latch assembly with a hand tool partially inserted into an assembly tool positioning aperture.

FIGS. 16 and 17 show tool blade 202 inserted through tool positioning aperture 128 and partially into tool-location cavity 142. At this point, tool blade 202 makes partial contact with ramp element 144 ramp surface 146.

FIGS. 18 and 21 show tool blade 202 inserted fully into tool-location cavity 142. At this point, tool blade 202 makes full contact with ramp element 144 and chamfered tool surface 130. The end of tool blade 202 is located proximate latch head 110.

Additionally as tool blade 202 is fully inserted into tool-location cavity 142, tool 200 is rotated from a vertical position as shown in FIG. 17 to an angled position as shown in FIG. 18 in the direction of arrow 204.

FIGS. 19 and 22 show tool blade 202 pivoted to exert a displacement force against latch head 110. Tool 200 is pivoted against chamfered tool surface 130 for tool blade to contact latch having camming surface 112.

FIG. 24 shows show tool blade 202 disengaging latch head 110 from retention element 136 so that hook retention surface 114 is displaced from retention surface 140.

Through the latch disengagement procedure, tool blade 202 exerts a displacement force 210 having force component vectors 212 and 213 as shown in FIG. 24. Component vector 214 provides for the deflection of latch arm 105 away from retention surface 140. Component vector 212 provides for displacement of faceplate 14 away from body 12. This simultaneous action effectively disengages faceplate 14 from base 12 in a single step.

Tool positioning aperture's 128 rectangular cross section 150 may be located so that major axis 152 is generally parallel to latch hook 108 camming surface 112. This allows a blade 202 inserted into aperture 128 and tool-location cavity 142 to establish reliable contact with latch head and camming surface 112. Additionally, rectangular cross section 150 is sized to prevent the mis-positioning blade 202 so that the blade properly actuates latch arm 105. This locating of tool positioning aperture's 128 also assures that tool blade 202 provides a displacement force 210 having force component vectors 212 and 213 as described herein.

The procedure is repeated for both actuation assemblies 100 to allow for removal of faceplate 14 from body 12.

At appropriate application of a displacement force 210, faceplate 14 is partially forced off of body 12 as latch head camming surface 112 passes along camming surface 138. This motion provides a user with physical feedback confirming proper latch actuation for faceplate removal.

While the present disclosure illustrates an electrical component enclosure 10 having a pair of actuation assemblies 100 located on opposed sides enclosure 12 to secure a faceplate thereto, alternate embodiments are contemplated. Alternate embodiments may include an enclosure having a single lid retention assembly 100 as well as enclosures having more than two actuation assemblies 100.

Also, while the present disclosure illustrates an actuation assembly 100 having a retention latch assembly 102 located on enclosure body 12 and a latch engagement assembly 104 located on faceplate 14, alternate embodiments are contemplated. Alternate embodiments may include an assembly having a actuation assembly 100 having a retention latch assembly 102 located on faceplace 14 and a latch engagement assembly 104 located on body 12.

While this disclosure discloses and describes various embodiments, it is understood that this is capable of modification and that the disclosure is not limited to the precise details set forth, but includes such changes and alterations as fall within the purview of the following claims.

We claim:
1. An enclosure assembly for an electrical component, said enclosure assembly comprising:
    an enclosure body, said enclosure body comprising opposed top and bottom walls, opposed side walls and a rear wall, said top, bottom, side and rear walls defining an enclosure internal cavity, an enclosure mouth opposed to said rear wall and extending from said enclosure internal cavity to the exterior of said enclosure body, said enclosure internal cavity comprising means to secure an electrical component within said internal cavity;

an enclosure faceplate comprising a faceplate body said faceplate body having a front side and a rear side, said faceplate comprising means to secure an electrical component thereto and adapted to engage said enclosure mouth;

at least one of said enclosure body and enclosure faceplate comprising a retention latch assembly, said retention latch assembly comprising a latch base joined to said one of said enclosure body or enclosure faceplate, a latch arm extending from said latch base to a latch hook and a hook retention surface;

at least one of said enclosure body and enclosure faceplate comprising a latch engagement assembly, said latch engagement assembly comprising an latch engagement assembly wall defining a latch engagement assembly cavity, said latch engagement assembly cavity comprising a retention element;

said retention latch assembly and latch engagement assembly comprising a faceplate actuation assembly, said faceplate actuation assembly comprising a tool location cavity proximate said latch head and extending from a tool positioning aperture into said latch engagement assembly cavity, said tool location cavity having a ramp element extending from said tool positioning aperture to a ramp base, said ramp element comprising a ramp surface;

wherein said enclosure assembly has an open configuration wherein said enclosure faceplate is removed from enclosure body and a closed configuration wherein said enclosure faceplate engages said enclosure mouth, said latch hook engages said retention element and said ramp surface facing said latch hook.

2. The assembly of claim 1 wherein said tool positioning aperture has a chamfered mouth.

3. The assembly of claim 2 wherein said latch hook comprises a caroming surface facing said ramp surface.

4. The assembly of claim 3 wherein said ramp element uniformly increases in size from said tool positioning aperture to said ramp base.

5. The assembly of claim 4 wherein said latch engagement assembly wall is C-shaped.

6. The assembly of claim 5 wherein said enclosure body walls and enclosure mouth are generally rectangular and wherein said faceplate body is generally rectangular and substantially flat.

7. The assembly of claim 6 wherein said means to secure an electrical component to said enclosure faceplate comprise at least one PCB holder slot.

8. The assembly of claim 7 wherein said means to secure an electrical component within said enclosure internal cavity comprise at least one PCB holder slot.

9. The assembly of claim 8 wherein said retention latch assembly latch base comprises a security aperture and said latch engagement assembly wall comprises a comprising latch security aperture wherein in said enclosure assembly closed configuration said security apertures are aligned.

10. The assembly of claim 4 wherein said tool location cavity uniformly decreases in size from said tool positioning aperture said ramp base.

11. An enclosure assembly for an electrical component comprising:

an enclosure body, said enclosure body comprising enclosure walls defining an enclosure internal cavity and an enclosure mouth extending from said enclosure internal cavity to the exterior of said enclosure body, said enclosure internal cavity comprising means to secure an electrical component within said internal cavity, said enclosure body further comprising an retention latch assembly, said retention latch assembly comprising a latch base proximate said enclosure mouth and a latch arm extending from said latch base to a latch hook;

an enclosure faceplate comprising means to secure an electrical component thereto and adapted to engage said enclosure mouth, said enclosure faceplate further comprising a latch engagement assembly, said latch engagement assembly comprising a retention element;

said retention latch engagement assembly and a latch engagement assembly comprising a faceplate actuation assembly comprising a tool location cavity extending from an aperture mouth to an aperture base said tool location cavity comprising a ramp element extending from said aperture mouth to said aperture base, said ramp element comprising a ramp surface;

wherein said enclosure assembly has an open configuration wherein said enclosure faceplate is removed from enclosure body and a closed configuration wherein said enclosure faceplate engages said enclosure mouth and said latch hook engages said retention element and said tool positioning aperture is proximate said retention element and said ramp surface facing said latch hook.

12. The assembly of claim 11 wherein said ramp element uniformly increases in size from said tool positioning aperture to said ramp base.

13. The assembly of claim 12 wherein said latch hook comprises a caroming surface and wherein in said closed configuration, said ramp surface faces said caroming surface.

14. The assembly of claim 13 wherein said enclosure mouth is generally rectangular in shape and said enclosure faceplate is generally rectangular in shape.

15. The assembly of claim 14 wherein said enclosure body means to secure an electrical component within said internal cavity comprise at least one PCB holder slot and wherein said enclosure faceplate means to secure an electrical component thereto comprise at least one PCB holder slot.

16. The assembly of claim 15 wherein said assembly faceplate is substantially flat and said faceplate comprises a mounting flange adapted to engage said enclosure mouth.

17. The assembly of claim 16 wherein said tool positioning aperture mouth comprises a chamfered mouth, an elongate tool element is located within said tool location cavity and in contact with said ramp surface and the assembly is actuated from said closed configuration to said open configuration by rotating the tool element in contact with said chamfered mouth and away from said ramp surface so that said tool element engages said latch hook caroming surface to disengage said latch hook from said retention element.

18. An enclosure assembly for an electrical component comprising an enclosure body, an assembly faceplate and a faceplate actuation assembly, said enclosure body comprising an enclosure internal cavity, an enclosure mouth and at least one PCB holder slot, said enclosure faceplate comprising a faceplate front side and a faceplate rear side, said faceplate rear side comprising at least one PCB holder slot, said faceplate actuation assembly comprising a retention latch engagement assembly on one of said enclosure body and enclosure faceplate and a latch engagement assembly on one of said enclosure body and enclosure faceplate, said retention latch engagement assembly comprising a latch comprising a latch arm and a latch hook, said latch engagement assembly comprising an latch engagement assembly wall defining a latch engagement assembly cavity, said latch engagement assembly cavity comprising a retention element, a tool location cavity extending into said latch engagement assembly cavity and comprising a ramp element extending generally from a tool positioning aperture mouth toward a positioning aperture base, said ramp element comprising a ramp surface facing toward said latch engagement assembly cavity wherein said enclosure assembly has an open configuration wherein said enclosure faceplate is removed from said enclosure body and a closed configuration wherein said enclosure faceplate engages said enclosure mouth and said latch hook engages said retention element and said tool location cavity is proximate said retention element.

19. The assembly of claim 18 wherein said latch hook comprises a caroming surface and wherein in said closed configuration, said ramp surface faces said caroming surface.

* * * * *

UNITED STATES PATENT AND TRADEMARK OFFICE
CERTIFICATE OF CORRECTION

| | | |
|---|---|---|
| PATENT NO. | : 11,357,120 B2 | Page 1 of 1 |
| APPLICATION NO. | : 17/018145 | |
| DATED | : June 7, 2022 | |
| INVENTOR(S) | : Dejan Raic et al. | |

It is certified that error appears in the above-identified patent and that said Letters Patent is hereby corrected as shown below:

In the Claims

Column 7, Line 39, replace "caroming" with --camming--;

Column 8, Line 31, Line 32 and Line 53, replace "caroming" with --camming--;

Column 9, Line 17 and Line 18, replace "caroming" with --camming--.

Signed and Sealed this
Nineteenth Day of July, 2022

*Katherine Kelly Vidal*

Katherine Kelly Vidal
*Director of the United States Patent and Trademark Office*